United States Patent
Arakawa et al.

(10) Patent No.: US 7,881,142 B2
(45) Date of Patent: Feb. 1, 2011

(54) STORAGE DEVICE AND CONTROL METHOD THEREOF

(75) Inventors: Hideki Arakawa, Tokyo (JP); Satoru Kawamoto, Aichi (JP)

(73) Assignee: Spansion LLC, Sunnyvale, CA (US)

( * ) Notice: Subject to any disclaimer, the term of this patent is extended or adjusted under 35 U.S.C. 154(b) by 1160 days.

(21) Appl. No.: 11/529,790

(22) Filed: Sep. 29, 2006

(65) Prior Publication Data

US 2007/0076492 A1 Apr. 5, 2007

Related U.S. Application Data

(63) Continuation-in-part of application No. PCT/JP2005/018085, filed on Sep. 30, 2005.

(51) Int. Cl.
*G11C 5/14* (2006.01)
(52) U.S. Cl. .................. 365/226; 365/227; 365/189.11
(58) Field of Classification Search .................. 365/226, 365/227, 189.11
See application file for complete search history.

(56) References Cited

U.S. PATENT DOCUMENTS 6,209,034 B1 * 3/2001 Gladwin et al. ............. 709/227
6,473,321 B2 * 10/2002 Kishimoto et al. ............ 363/59

FOREIGN PATENT DOCUMENTS

| JP | 10106283 | 4/1998 |
| JP | 10241385 | 9/1998 |
| JP | 2001338493 | 12/2001 |
| JP | 2002373490 | 12/2002 |

* cited by examiner

*Primary Examiner*—Son Dinh

(57) ABSTRACT

A storage device and its control method are described, according to which a bias voltage to be supplied to a memory cell array is selected from boosted voltages which are increased from an external voltage and non-boosted voltages which are not increased from the external voltage. In the period during which a DC-DC converter section supplies a boosted voltage increased from the external voltage to an internal bias line for supplying a bias voltage to the memory cell array, a non-boosted voltage supply section for supplying a non-boosted voltage equal to or less than the external voltage is in its inactive state. In the period during which the non-boosted voltage supply section supplies a non-boosted voltage to the internal bias line, the DC-DC converter section is in its inactive state. In the period during which a boosted voltage is supplied to the internal bias line, the DC-DC converter section is used for ensuring sufficient power supply ability, and in the period during which the non-boosted voltage is supplied to the internal bias line, the DC-DC converter section can be kept in its inactive state. Thus, the power consumed by the DC-DC converter section can be saved in the period during which the supply of a boosted voltage is unnecessary.

37 Claims, 11 Drawing Sheets

| OPERATION MODE | DC-DC CONVERTER SECTION | NON-BOOSTED VOLTAGE SUPPLY SECTION | VCC | CONSUMPTION CURRENT |
|---|---|---|---|---|
| Idle | ON | OFF | 3.0V | 2mA |
| PD | OFF | ON | 1.8V | 100uA |
| DPD | OFF | ON | 0.5~1.0V | 1uA |

FIG.4

| OPERATION MODE | DC-DC CONVERTER SECTION | NON-BOOSTED VOLTAGE SUPPLY SECTION | VPP | CONSUMPTION CURRENT |
|---|---|---|---|---|
| Active [Program/Erase/Read] | ON | OFF | 4.0~7.0V | 10~30mA |
| Idle1 | OFF | ON | 1.8V | 5uA |
| Idle2 | OFF | OFF | 0.0V | 0uA |

FIG.6

| OPERATION MODE | DC-DC CONVERTER SECTION | NON-BOOSTED VOLTAGE SUPPLY SECTION | VPP | CONSUMPTION CURRENT |
|---|---|---|---|---|
| ID / RD | ON | OFF | 4.0V | 2~10mA |
| PG / ER | ON | OFF | 7.0V / 7.5V | 20~30mA |
| VR | ON | OFF | 4.5V | 12mA |
| PD | OFF | ON | 1.8V | 5uA |
| DPD | OFF | ON | 0.5~1.0V | 1uA |

FIG.8

| OPERATION MODE | DC-DC CONVERTER SECTION (1) | DC-DC CONVERTER SECTION (2) | NON-BOOSTED VOLTAGE SUPPLY SECTION (1) | NON-BOOSTED VOLTAGE SUPPLY SECTION (2) | VPP 1 | VPP 2 |
|---|---|---|---|---|---|---|
| ID / RD | OFF | ON | ON | OFF | 0.5V / 1.8V | 4.0V |
| PG / ER | ON | OFF | OFF | ON | 7.0V / 7.5V | 0.5V / 1.8V |
| VR | OFF | ON | ON | OFF | 0.5V / 1.8V | 4.0V |
| PD | OFF | OFF | ON | ON | 1.8V | 1.8V |
| DPD | OFF | OFF | ON | ON | 0.5V | 0.5V |

STORAGE DEVICE AND CONTROL METHOD THEREOF

CROSS-REFERENCES TO RELATED APPLICATIONS

This is a continuation in part of International Application No. PCT/JP2005/018085, filed Sep. 30, 2005, which was not published in English under PCT Article 21(2).

TECHNICAL FIELD

The present invention relates to a storage device and a control method thereof.

BACKGROUND ART

In the memory circuit disclosed in U.S. Pat. No. 6,744,669 B2 Publication, a boosted voltage that is increased from a power supply voltage VCC and required for rewriting or erasing operation is supplied to an array of memory cells by a boost circuit 200 as shown in FIG. 2 of U.S. Pat. No. 6,744,669 B2 Publication. The boost circuit 200 is a so-called booster type DC-DC converter circuit having an inductive element 210, a switching transistor T1, a diode D1 and a capacitor C2. Cyclic control signals make the switching transistor T1 periodically conductive. When the switching transistor T1 is in its conductive state, a current flows from the power supply VCC to ground potential through the inductive element 210 and the switching transistor T1. Thereby, the inductive element 210 builds up energy. When the switching transistor T1 becomes nonconductive, the drain terminal voltage of the switching transistor T1 rises and the energy is transferred to the capacitor C2 through the diode D1. This causes the terminal voltage of the capacitor C2 to increase from the power supply voltage VCC so that a boosted voltage is fed from the output terminal Output.

Herein, the diode D1 is constructed by wire connection of the gate terminal and drain terminal of an NMOS transistor as shown in the drawing. The drain terminal of the NMOS transistor functions as the anode terminal of the diode whereas the source terminal of the NMOS transistor as the cathode terminal of the diode. The drain terminal is connected to the inductive element 210 whereas the source terminal is connected to the output terminal Output, with the direction from the inductive element 210 to the output terminal Output serving as a forward direction. When the switching transistor T1 is conductive, the diode D1 is reversely biased to prevent a reverse flow of the boosted voltage from the output terminal Output. When the switching transistor T1 is nonconductive, voltages at the switching transistor T1 and the drain of the NMOS transistor are increased by the energy released from the inductive element 210 so that the diode D1 is forwardly biased and a boosted voltage is outputted to the output terminal Output.

BRIEF DESCRIPTION OF THE DRAWINGS

FIG. 4 shows other biasing conditions for each operation state according to the first embodiment.

FIG. 6 shows biasing conditions for each operation state according to the second embodiment.

FIG. 8 shows biasing conditions for each operation state according to the third embodiment.

DETAILED DESCRIPTION

Figure 1:
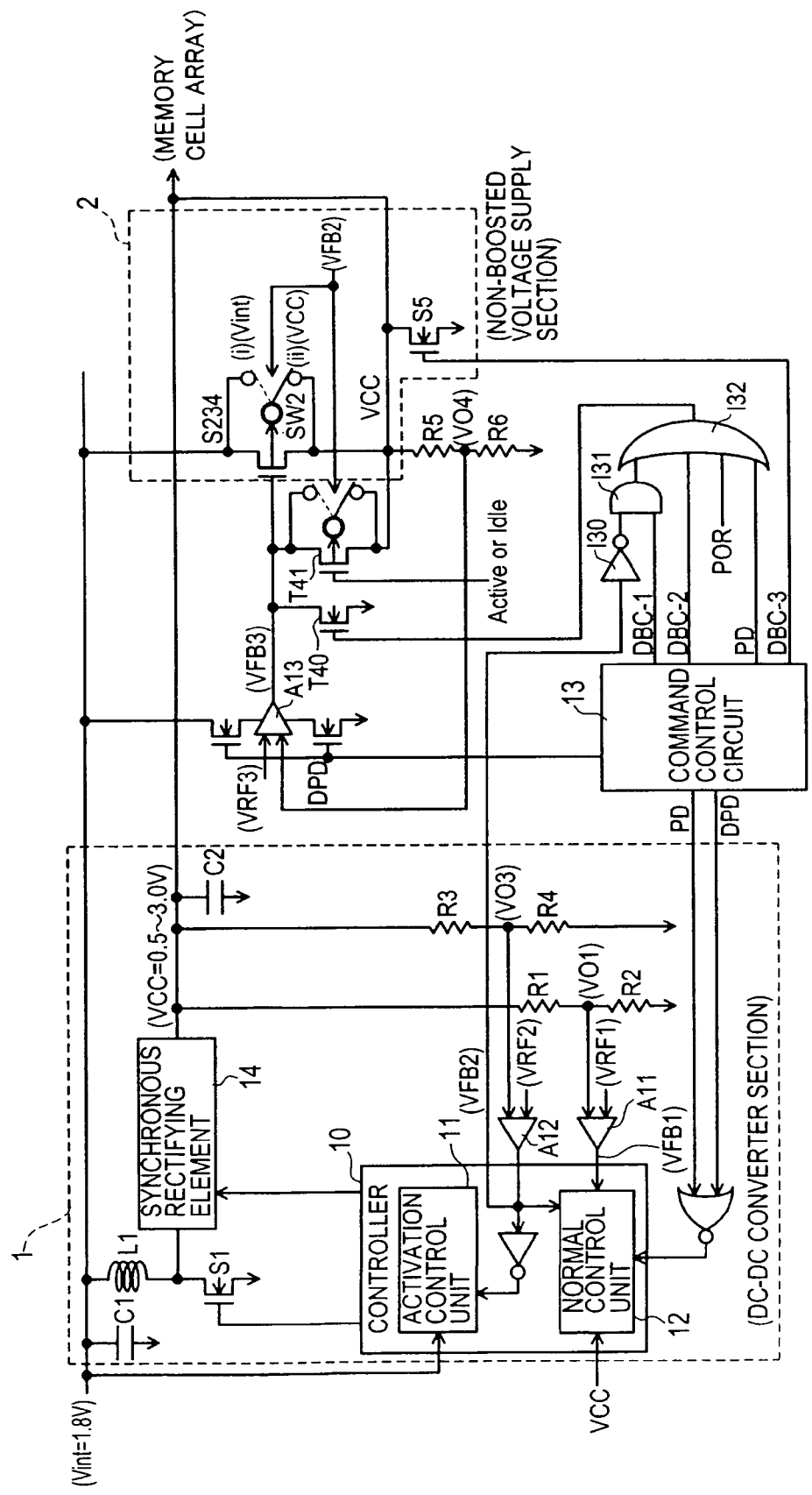
FIG. 1 is a circuit block diagram illustrating a first embodiment.

Reference will now be made in detail to embodiments of the present claimed subject matter, examples of which are illustrated in the accompanying drawings. While the claimed subject matter will be described in conjunction with these embodiments, it will be understood that they are not intended to limit the claimed subject matter to these embodiments. On the contrary, the claimed subject matter is intended to cover alternatives, modifications and equivalents, which may be included within the spirit and scope of the claimed subject matter as defined by the appended claims. Furthermore, in the following detailed description of the present claimed subject matter, numerous specific details are set forth in order to provide a thorough understanding of the present claimed subject matter. However, it will be evident to one of ordinary skill in the art that the present claimed subject matter may be practiced without these specific details. In other instances, well known methods, procedures, components, and circuits have not been described in detail as not to unnecessarily obscure aspects of the claimed subject matter.

Overview

If a bias voltage higher than an external voltage needs to be applied to a memory cell array during data readout or data rewriting operation that involves accessing to the memory cell array, it is necessary to start up the booster type DC-DC converter disclosed in U.S. Pat. No. 6,744,669 B2 Publication.

In this case, access operation may be performed with arbitrary timing after turning on the power supply. Since a boosted bias voltage is supplied without delay upon starting of access operation, the DC-DC converter section needs to be put in operation after turning on the power supply. Even in a stand-by state in which a boosted bias voltage is not required, the DC-DC converter section operates, so that power consumption cannot be reduced.

Power consumption can be reduced by suspending the DC-DC converter section in the stand-by state. However, when the DC-DC converter section is started again in response to an access request, a considerable period of time elapses until the operation of the DC-DC converter section is brought into a steady state by charging the capacitor C2 etc. and the DC-DC converter section outputs a voltage of a specified value. The time elapsing from the instant when an access request is released until the instant when a bias voltage is supplied could be a limiting factor for high-speed accessing operation.

In addition, while the DC-DC converter transitions from its active state to its inactive state, it is necessary to adjust the secondary voltage which is large in the quantity of electric charge to a specified voltage at high speed by the capacitor C2 etc.

Also, during a mode transition in which the secondary voltage is downwardly revised while the DC-DC converter is in its active state, the secondary voltage which is large in the quantity of electric charge needs to be downwardly adjusted to a specified value at high speed by the capacitor C2 etc.

Further, in cases where a DC-DC converter is provided for every desired secondary voltage or every location to which the secondary voltage is applied, the above-described drawback arises in the high-speed accessing operation and a further reduction in power consumption becomes necessary.

Embodiments have been made taking account of the background art described earlier and one object of the invention is therefore to provide a storage device and a control method thereof, according to which when boosted voltages that are increased from an external voltage and non-boosted voltages that are not increased from the external voltage are selectively supplied to a memory cell array as a bias voltage, power consumption can be reduced through the operation control of a DC-DC converter section and the time required for starting the DC-DC converter section can be reduced. Another object of the invention is to provide a storage device and a control method thereof, in which the secondary voltage can be adjusted to a desired value at high speed. A further object of the invention is to provide a storage device and a control method thereof, according to which where a plurality of DC-DC converters are provided, capacitors C2 etc. efficiently utilize the electric charges of the secondary voltages which are large in the quantity of electric charge, thereby enabling high-speed operation and eliminating wasteful power consumption.

In one particular embodiment, there is provided a storage device including:

a memory cell array;

an internal bias line which supplies a bias voltage to the memory cell array;

a DC-DC converter section having an output line coupled to the internal bias line, the DC-DC converter section boosting an external voltage to supply a boosted voltage to the output line thereof; and a non-boosted voltage supply section having an output line coupled to the internal bias line for supplying a non-boosted voltage equal to or less than the external voltage to the output line thereof, wherein the non-boosted voltage supply section does not supply the non-boosted voltage to its output line when the internal bias line is maintained at the boosted voltage, and wherein the DC-DC converter section does not supply the boosted voltage to its output line when the internal bias line is maintained at the non-boosted voltage.

In the storage device of the invention, during a time period in which the DC-DC converter section supplies a boosted voltage higher than the external voltage to the internal bias line for supplying a bias voltage to the memory cell array etc., the non-boosted voltage supply section for supplying a non-boosted voltage equal to or less than the external voltage is brought into its inactive state. During a time period in which the non-boosted voltage supply section supplies a non-boosted voltage to the internal bias line, the DC-DC converter section is brought into its inactive state.

Further, there is provided an example method for controlling a storage device that supplies either a boosted voltage resulting from an external voltage or a non-boosted voltage whose value is equal to or less than the external voltage to an internal bias line in a memory cell array, the method comprising the steps of;

suspending generation of the non-boosted voltage when maintaining the internal bias line at the boosted voltage; and suspending generation of the boosted voltage when maintaining the internal bias line is maintained at the non-boosted voltage.

According to the example control method for the storage device of the invention, when the internal bias line of the memory cell array etc. is maintained at a boosted voltage higher than the external voltage, generation of a non-boosted voltage equal to or less than the external voltage is suspended. When the internal bias line of the memory cell array etc. is maintained at a non-boosted voltage, generation of a boosted voltage is suspended.

With the above arrangement, during the period in which a boosted voltage is supplied to the internal bias line, a sufficient amount of electric power supply is ensured by the DC-DC converter section. During the period in which a non-boosted voltage is supplied to the internal bias line, the DC-DC converter section is brought into its inactive state or generation of a boosted voltage is stopped. During the period in which supply of a boosted voltage to the internal bias line is unnecessary, power consumption caused by the DC-DC converter section or caused by generation of a boosted voltage can be prevented, which leads to reductions in overall electric power consumption.

Additionally, the storage device of the invention is characterized in that the non-boosted voltage supply section prior supplies the non-boosted voltage to the internal bias line before activation of the DC-DC converter and after activation of the DC-DC converter until the internal bias line reaches the boosted voltage.

The control method for the storage device of the invention is characterized by the step of supplying a non-boosted voltage to the internal bias line prior to the internal bias line reaching a boosted voltage which has been supplied thereto.

In addition, the storage device of the invention is characterized in that the non-boosted voltage supply section discharges the internal bias line after activation of the DC-DC converter section and suspension of the DC-DC converter section.

In addition, the control method for the storage device of the invention is characterized by the step of discharging the internal bias line so that the voltage at the internal bias line drops from a boosted voltage down to a non-boosted voltage, after suspension of the DC-DC converter section.

In addition, the storage device of the invention is characterized in that the non-boosted voltage supply section discharges the internal bias line during a mode transition for downwardly revising the secondary voltage after activation of the DC-DC converter section.

In addition, the control method for the storage device of the invention is characterized by the step of discharging the internal bias line so that the voltage at the internal bias line drops from a boosted voltage to a downwardly revised boosted voltage, during a mode transition for downwardly revising the secondary voltage.

In addition, the storage device of the invention is characterized by a line switch element provided between the secondary terminals of every two of a plurality of DC-DC converter sections.

Further, the control method for the storage device of the invention is characterized in that according to the activation/non-activation control of the plurality of DC-DC converters, remaining electric charges in the secondaries of the DC-DC converters are transferred.

Thus, in the process of supplying the internal bias line with a boosted voltage in response to activation of the DC-DC converter section, the non-boosted voltage supply section performs voltage supply operation or a non-boosted voltage is supplied, so that the prior voltage supply to the internal bias line is done. Therefore, the time elapsing until the internal bias line reaches the boosted voltage subsequently to actuation of the DC-DC converter section is reduced. If the DC-DC converter section is actuated in response to a command instructive of starting an access operation that requires supplying of a boosted voltage to the memory cell array etc., the time elapsing from the release of the starting command until the supply of the boosted voltage is completed thereby making the access operation ready is reduced, so that the access operation can be speeded up. Additionally, the internal bias line is discharged after suspension of the DC-DC converter section and/or during the operation of the DC-DC converter section, thereby reducing the time required for adjusting the secondary voltage, which is large in the quantity of electric charge, to a specified voltage by use of the capacitors C2 etc., so that starting of various operations can be speeded up.

Further, remaining electric charges in the secondaries of the plurality of DC-DC converters are transferred according to the activation/non-activation control of the plurality of DC-DC converters, so that the capacitors C2 etc. make efficient use of their secondary voltages which are large in the quantity of electric charge, thereby eliminating wasteful power consumption.

According to the invention, when boosted voltages that are increased from an external voltage and non-boosted voltages that are not increased from the external voltage are selectively supplied as a bias voltage to the memory cell array etc. according to access operations, the DC-DC converter section is suspended during a period in which a non-boosted voltage is supplied, thereby reducing power consumption, and prior supply of power to the internal bias line is done at the time of actuation of the DC-DC converter section, thereby reducing the time elapsing until the boosted voltage is supplied.

Referring now to FIGS. 1 to 8 of the accompanying drawings, the storage device and control method of the invention will be hereinafter described in detail according to example embodiments.

FIGS. 1 to 4 illustrate a first embodiment. The first embodiment is associated with a case where a power supply voltage VCC is supplied as a bias voltage to an internal bias line for feeding a bias voltage to a memory cell array etc.

FIG. 1 shows a circuit block diagram. A controller 10 provided in a DC-DC converter section 1 includes an activation control unit 11 operated with an external voltage (Vint=1.8V) that is a primary voltage and a normal control unit 12 operated with a boosted voltage (that is a power supply voltage VCC=3.0V supplied to the memory cell array etc.) that is a secondary voltage. A capacitor element C1 is connected to the primary voltage whereas a capacitor element C2 is connected to the secondary voltage. A synchronous rectifying element and a switching transistor S1 are connected to the primary through an inductor element L1. Input to an amplifier A12 are a feedback voltage V03 and a set voltage VRF2. The feedback voltage V03 is a bias voltage outputted from the DC-DC converter section 1 as a feedback of the power supply voltage VCC. The differential voltage obtained by subtracting the feedback voltage V03 from the set voltage VRF2 is amplified and outputted as a voltage VFB2. Herein, the set voltage VRF2 is a reference voltage that indicates the power supply voltage VCC is about 1.7V and the feedback voltage V03 is an adjusted voltage obtained by adjusting the power supply voltage VCC with a resistive potential divider.

The output of the voltage VFB2 is reversed when the power supply voltage VCC is in the vicinity of 1.7V. At a cold start of the memory system, the activation control unit 11 operates to start a boosting operation when the external voltage is about 0.9V that is a circuit operation starting point. When the power supply voltage VCC is about 1.7V, the activation control unit 11 stops and the normal control unit 12, which is operated at the boosted voltage (i.e., the secondary voltage), starts a boosting operation. Input to the amplifier A11 are a feedback voltage V01 and a set voltage VRF1, the feedback voltage V01 being a bias voltage outputted from the DC-DC converter section 1 as a feedback of the power supply voltage VCC. The differential voltage obtained by subtracting the feedback voltage V01 from the set voltage VRF1 is amplified and outputted as a voltage VFB1. Herein, the set voltage VRF1 is a reference voltage that indicates the power supply voltage VCC is about 3.0 V and the feedback voltage V01 is an adjusted voltage obtained by adjusting the power supply voltage VCC with a resistive potential divider. The voltage VFB1 is reversed when the power supply voltage VCC is in the vicinity of 3.0V.

It should be noted that the controller 10 performs activation/non-activation control in response to the output of a logic circuit to which a power down control signal PD (described later) and a deep power down control signal DPD (described later) are input and that during the activation control, synchronous rectifying is effected to perform the boosting operation.

In a non-boosted voltage supply section 2, a back bias is controlled by a switch SW. 2. The non-boosted voltage supply section 2 is constituted by a P channel transistor S234 connected between the external voltage Vint and the power supply voltage VCC and an N channel transistor S5 connected between the power supply voltage VCC and ground voltage.

The non-boosted voltage supply section 2 is controlled by a circuit of the following configuration. There are provided (i) an amplifier A13 that is activated in response to the deep power down control signal DPD for adjusting the secondary voltage to a value lower than the external voltage and is connected between the external voltage Vint and the ground voltage; and (ii) an N channel transistor T40 connected between the output of the amplifier A13 and the ground voltage, which output is generated by combining various control signals from a command control circuit 13 (iii) a P channel transistor T41 connected between the gate of the P channel transistor S234 and the power supply voltage VCC. The back bias of the P channel transistor T41 is controlled similarly to the P channel transistor S234. Input to the amplifier A13 are a feedback voltage V04 and a set voltage VRF3, the feedback voltage V04 being a feedback of the output power supply voltage VCC. The set voltage VRF3 is a reference voltage that indicates the power supply voltage VCC is about 0.5V at which the sub-threshold current consumed by the memory cell array etc. in the deep power down operation becomes minimum. The differential voltage obtained by subtracting the feedback voltage V04 from the set voltage VRF3 is amplified and outputted as a voltage VFB3 which is in turn input to the gate of the P channel transistor S234. Herein, the feedback voltage V04 is an adjusted voltage obtained by adjusting the power supply voltage VCC with a resistive potential divider. The power supply voltage VCC is stepped down, by the amplifier A13 and the P channel transistor S234, from the external voltage Vint to about 0.5V in the deep power down operation. The N-channel transistor T40 electrically charges and discharges the power supply voltage VCC at the time of a cold start, at the time of the power down operation and at the time of a mode transition of the memory system.

In response to a power-ON reset signal POR that is outputted in the form of one shot pulse upon detection of a cold start of the memory system, the N channel transistor T40 is activated for a specified period of time and the P channel transistor S234 becomes conductive, whereby the internal bias line which is supplied with the power supply voltage VCC is electrically charged. Thereby, the internal bias line is electrically charged before the activation control unit 11 which operates at about 0.9V (=the circuit operation starting point) and the diode reach their threshold voltage points. Furthermore, thanks to the internal bias line being charged while the activation control unit 11 being operated, the normal control unit 12 is operated at an early stage. The normal control unit 12, which determines the characteristics of the boosting ability inherent to the DC-DC converter, is thus operated at an early stage, thereby setting the secondary voltage to a specified value at an early stage.

In the power down period during which the secondary voltage is controlled so as to be equal to the external voltage, the N channel transistor T40 makes, in response to a power down signal PD, the P channel transistor S234 electrically conductive during this period and makes the power supply voltage VCC and the external voltage Vint be at the same potential. A command transition detection signal DBC-1 is a one-shot pulse signal generated by the command control circuit 13 during a mode transition in which the deep power down mode transitions to an idle mode or the power down mode. By activating the N channel transistor T40 for a specified period of time, the P channel transistor S234 is made to be conductive and electric charge is charge returned so that from the external voltage Vint > the power supply voltage VCC state to the external voltage Vint □ the power supply voltage VCC state. When returning to the idle mode, the secondary voltage can be set to a specified value at an early stage while assisting the DC-DC converter section 1.

The termination of the above specified time is decided upon reversal of the voltage VFB2 and the command transition detection signal DBC-1 is made inactive by the logic gate 131. The normal control unit 12 starts the boosting operation while the conductive-active state of the P channel transistor S234 of the non-boosted voltage supply section is interrupted, whereby a reverse flow of current is prevented. A command transition detection signal DBC-2 is a one-shot pulse signal generated by the command control circuit 13 during a mode transition in which the idle mode transitions to the power down mode or the deep power down mode. By activating the N channel transistor T40 for a specified period of time, the P channel transistor S234 is made conductive and electric charge is discharge returned so that from the external voltage Vint < the power supply voltage VCC state to the external voltage Vint □ the power supply voltage VCC state. Like the command transition detection signal DBC-1, the termination of the specified period of time may be decided by a signal similar to the voltage VFB2, thereby preventing a reverse flow of current.

The P channel transistor T41 stops the P channel transistor S234 during the idling time except the power down period and the deep power down period. The P channel transistor T41 becomes active after the N channel transistor T40 has become inactive, thereby preventing a leak current from the power supply voltage VCC to the ground voltage.

The back gate of the P channel transistors S234, T41 is controlled by the voltage VFB2 so as to be connected to either the external voltage Vint or the power supply voltage VCC. Although this back gate is basically connected to the power supply voltage VCC, forward bias of a PN junction can be prevented by switching to the external voltage Vint when the power source voltage VCC is in the vicinity of 1.7V during the deep power down period where the external voltage Vint > the power supply voltage VCC. It is also possible to connect the back gate to either of the external voltage Vint and the power supply voltage VCC during the power down period.

A command transition detection command DBC-3 is a one-shot pulse signal generated by the command control circuit 13 during a mode transition to the deep power down mode. By activating the N channel transistor S5 for a specified period of time, electricity is discharged so that from the external voltage Vint □ the power supply voltage VCC state to the external voltage Vint > the power supply voltage VCC state. In one particular embodiment, the command transition detection command DBC-3 is generated after electric discharge is done by a return to the state where the external voltage Vint =the power supply voltage VCC in response to the command transition detection signal DBC-2. The power supply voltage VCC is once discharged to the external voltage Vint and then to the ground voltage, whereby the noise of the power supply is reduced. It is also possible to prevent a reverse flow of current by determining the start and termination of the specified period of time according to a signal similar to the voltage VFB2, like the case of the command transition detection signal DBC-1.

Figures 2, 3:
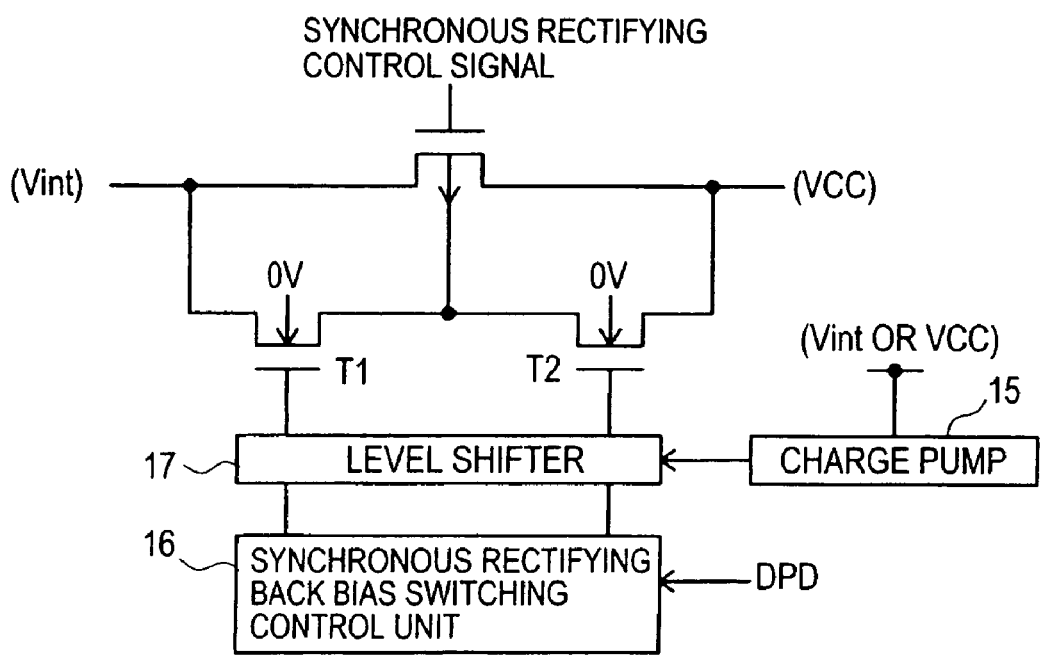
FIG. 2 shows biasing conditions for each operation state according to the first embodiment.
FIG. 3 concretely illustrates a synchronous rectifying element 14 and P channel transistors S234, T41 according to the first embodiment.

FIG. 2 shows biasing conditions sorted by operation states. The following description is based on the assumption that 1.8V is supplied as the external voltage Vint. In the idle state Idle of the normal operating state (which includes both the state of accessing the memory cell array and the state of awaiting the access operation), the DC-DC converter section 1 is in its active state (ON), whereas the non-boosted voltage supply section 2 is in its inactive state (OFF). The power supply voltage VCC is supplied with a boosted voltage of 3.0V from the DC-DC converter section. In the power down state PD, the DC-DC converter section 1 is in its inactive state (OFF), whereas the non-boosted voltage supply section 2 is in its active state (ON). The power supply voltage VCC is supplied with the external voltage Vint, i.e., 1.8V from the non-boosted voltage supply section. In the deep power down state DPD, the DC-DC converter section 1 is in its inactive state (OFF), whereas the non-boosted voltage supply section 2 is in its active state (ON). The power supply voltage VCC is supplied with a voltage from the non-boosted voltage supply section, the voltage ranging from 0.5 to 1.0V which is lower than the external voltage Vint. For reference, one example of the amount of current consumed in each operation state is shown. In the wait state of the idle state Idle, current consumption is 2 mA and this current is mainly consumed by the DC-DC converter section in a non-loaded condition. In the power down state PD, current consumption is reduced to 100 μA and this current is mainly consumed by the memory cell array etc. In the deep power down state DPD, it is further reduced to 1 μA at which the sub-threshold current consumed by the memory cell array etc. becomes minimum. It should be noted that in the access state of the idle state Idle, the DC-DC converter section is in a loaded condition and therefore its current consumption is 10 to 30 mA.

Herein, the idle state is a state in which a request for accessing the memory cell array is awaited. In response to an access request, the highest-speed access operation starts. The power down state PD and the deep power down state DPD are states in which current consumption is reduced irrespective of an issue of an access request.

A mode transition, i.e., a sequence of shifting from one operation state to another will be described below. At a cold start after turning on the power supply, the P channel transistor S234 first becomes conductive so that the power supply voltage VCC to be fed to the internal bias line is supplied from the external voltage Vint. After the power supply voltage VCC reaches the operation starting point of the DC-DC converter section 1, the DC-DC converter section 1 makes the power supply voltage VCC to reach a voltage (e.g., 3.0V) for the stationary state. This is the idle state Idle.

During a transition from the idle state Idle to the power down state PD, the DC-DC converter section 1 firstly stops the boosting operation.

Then, the P channel transistor S234 becomes conductive in response to one shot pulse of the command transition detection signal DBC-2, so that the power supply voltage VCC changes from 3.0V to 1.8V that is equal to the external voltage Vint. Thereafter, the P channel transistor S234 becomes conductive in response to the power down signal PD, thereby maintaining the power supply voltage VCC at 1.8V that is the external voltage Vint.

During a transition from the idle state Idle to the deep power down state DPD, the DC-DC converter section 1 firstly stops the boosting operation. Then, the P channel transistor S234 becomes conductive in response to one shot pulse of the command transition detection signal DBC-2, so that the power supply voltage VCC changes from 3.0V to 1.8V that is equal to the external voltage Vint. Thereafter, the N channel transistor S5 becomes conductive in response to one shot pulse of a command transition detection signal DBC-3, so that the power supply voltage VCC reaches the state where the external voltage Vint > the power supply voltage VCC (e.g., 0.5V). Thereafter, the P channel transistor S234 is conductivity-controlled by the amplifier A13 such that the power supply voltage VCC is stepped down to 0.5V and maintained thereat.

During a transition from the power down state PD to the deep power down state DPD, the N channel transistor T40 first becomes inactive and the P channel transistor S234 becomes inactive. Then, the N channel transistor S5 becomes conductive in response to one shot pulse of the command transition detection signal DBC-3, so that the power supply voltage VCC reaches the state where the external voltage Vint > the power supply voltage VCC (e.g., 0.5V). Thereafter, the P channel transistor S234 is conductivity-controlled by the amplifier A13 such that the power supply voltage VCC is stepped down to 0.5V and maintained thereat.

During a transition from the deep power down state DPD to the power down state PD, the P channel transistor S234 first becomes conductive in response to one shot pulse of the command transition detection signal DBC-1, so that the power supply voltage VCC changes from 0.5V to 1.8V that is equal to the external voltage Vint. Thereafter, the P channel transistor S234 becomes conductive in response to the power down signal PD and this voltage is maintained.

During a transition from the power down state PD to the idle state Idle, the N channel transistor T40 becomes inactive and the P channel transistor S234 becomes inactive. When the DC-DC converter section 1 reaches the operation starting point in this period, the DC-DC converter section 1 starts the boosting operation and the power supply voltage VCC reaches 3.0V and is maintained thereat.

During a transition from the deep power down state DPD to the idle state Idle, the amplifier A13 becomes inactive while the P channel transistor S234 becomes conductive in response to one shot pulse of the command transition detection signal DBC-1, so that the power supply voltage VCC changes from 0.5V to 1.8V that is equal to the external voltage Vint. Thereafter, the DC-DC converter section 1 starts the boosting operation and the power supply voltage VCC reaches 3.0V and is maintained thereat.

According to the first embodiment, the power supply voltage VCC is generatively controlled in the deep power down state by the P channel transistor S234 with a voltage of e.g., about 0.5V at which the sub-threshold current consumed by the memory cell array etc. becomes minimum, so that not only a reduction in the current consumption of the DC-DC converter section 1 can be achieved by bringing the DC-DC converter section 1 to a stop, but also the current consumption of the memory system can be minimized. In addition, at the time of cold starting or a mode transition, the power supply voltage VCC can be transitioned to a specified voltage at high speed while the DC-DC converter section 1 being assisted. Further, noise can be reduced by arranging the order of occurrence of electric discharge.

FIG. 3 shows a concrete example of a synchronous rectifying element 14 and the P channel transistors S234, T41.

The synchronous rectifying element 14 provided for the booster type DC-DC converter section 1 must be constituted by P channel transistors. While the DC-DC converter section 1 is in operation, the well voltage is, in one particular embodiment, connected to the power supply voltage VCC that is the boosted voltage (together with the P channel transistors S234, T41 (connection case ii)). In contrast with this, in low power modes such as the power down state PD and the deep power down state DPD, the DC-DC converter section 1 is suspended. In this case, the well voltage is connected to the external voltage Vint (together with the P channel transistors S234, T41 (connection case i)) so as not to forwardly bias the PN junction.

The current driving ability of the P channel transistors that constitute the synchronous rectifying element is extremely high and therefore the parasitic capacitance of the well is high. However, if switching is done after the power supply voltage VCC transitions to the voltage equal to the external voltage Vint, the current necessary for the switching of the well potential does not increase. Therefore, the switching elements T1, T2 for switching the well voltage do not need to be large in transistor size irrespective of the size of the synchronous rectifying element.

In the case of the connection (i), a high level voltage is applied to the gate of the N channel transistor T1 from a charge pump 15 through a level shifter 17. A voltage obtained by adding a threshold voltage Vthn for the N channel transistor T1 to the external voltage Vint is given.

In the case of the connection (ii), a high level voltage is applied to the gate of the N channel transistor T2 from the charge pump 15 through the level shifter 17. A voltage obtained by adding a threshold voltage Vthn for the N channel transistor T2 to the power supply voltage VCC is given.

The switching control of the N channel transistors T1, T2 is performed by a synchronous rectifying back bias switching control unit 16 in response to a deep power down control signal DPD.

Where the synchronous rectifying element is constituted by N channel transistors, their gate has to be boosted. Since the frequency of a synchronous rectifying control signal is high and the gate capacitance is great, power consumption increases. In contrast with this, the synchronous rectifying element 14 shown in FIG. 3 uses P channel transistors and therefore boosting of the gate can be replaced with controlling of the back gate only in the deep power down mode. This obviates the need for making the charge pump 15 have high capacitance corresponding to the frequency of a synchronous rectifying control signal.

Another arrangement is such that, in place of boosting the well of the P channel transistors of the synchronous rectifying element by a charge pump, N channel transistors T1, T2 for controlling the well are provided and their gate is boosted to charge electricity so that the well voltage becomes equal to the external voltage Vint or the power supply voltage VCC. Since the gate capacitance of the N channel transistors T1, T2 is small compared to the well capacitance of the P channel transistors of the synchronous rectifying element, current consumption at the time of driving can be restricted.

Where an internal power supply voltage higher than the power supply voltage VCC is used for the word line, bit line and well voltage of the memory cell array etc. in the first embodiment, a boosted voltage VPP which is further internally stepped up from the power supply voltage VCC is generated by a charge pump circuit (not shown) connected to the power supply voltage VCC.

Although the first embodiment has been discussed in terms of a case where the power supply voltage VCC is supplied from the DC-DC converter section 1 to the memory cell array etc., the voltage to be supplied is not necessarily limited to the power supply voltage VCC. In cases where the memory cell array is constituted by non-volatile memories as shown in FIG. 4, a boosted voltage VPP for biasing the non-volatile memories may be supplied. In the program mode, erase mode and readout mode which correspond to the access operating state of the normal operating state, the DC-DC converter section 1 is in its active state (ON) whereas the non-boosted voltage supply section 2 is in its inactive state (OFF). 4.0V to 7.0V are supplied as the boosted voltage VPP in accordance with the modes. In the first idle state Idle1, the DC-DC converter section 1 is in its inactive state (OFF), whereas the non-boosted voltage supply section 2 is in its active state (ON). 1.8V which is equal to the external voltage Vint is supplied as the boosted voltage VPP. In the second idle state Idle2, the DC-DC converter section 1 is in the inactive state (OFF) and the non-boosted voltage supply section 2 is in the inactive state (OFF). During the second idle state Idle2, the command transition detection signal DBC-3 is altered to make the N channel transistor S5 conductive, thereby supplying 0V as the boosted voltage VPP. For reference, one example of the amount of current consumed in each operation state is shown. In the access operating state of the normal operating state, current consumption is 10 to 30 mA that is equal to the current consumption of the DC-DC converter section in a loaded condition corresponding to the program mode, erase mode and readout mode. In the first idle state Idle1, the sub-threshold current consumed by the circuit connected to the boosted voltage VPP is reduced to 5 µA. In the second idle state Idle2, it is further reduced to 0 µA.

Herein, the first idle state Idle1 is an inactive state existing between two access operations among the program mode, erase mode and readout mode which correspond to the access operating state of the normal operating state.

The second embodiment is associated with a case in which the memory cell array is constituted by non-volatile memories and the boosted voltage VPP for biasing the memory cells in the programming, erasing or readout operation is supplied to the internal bias line.

Figure 5:
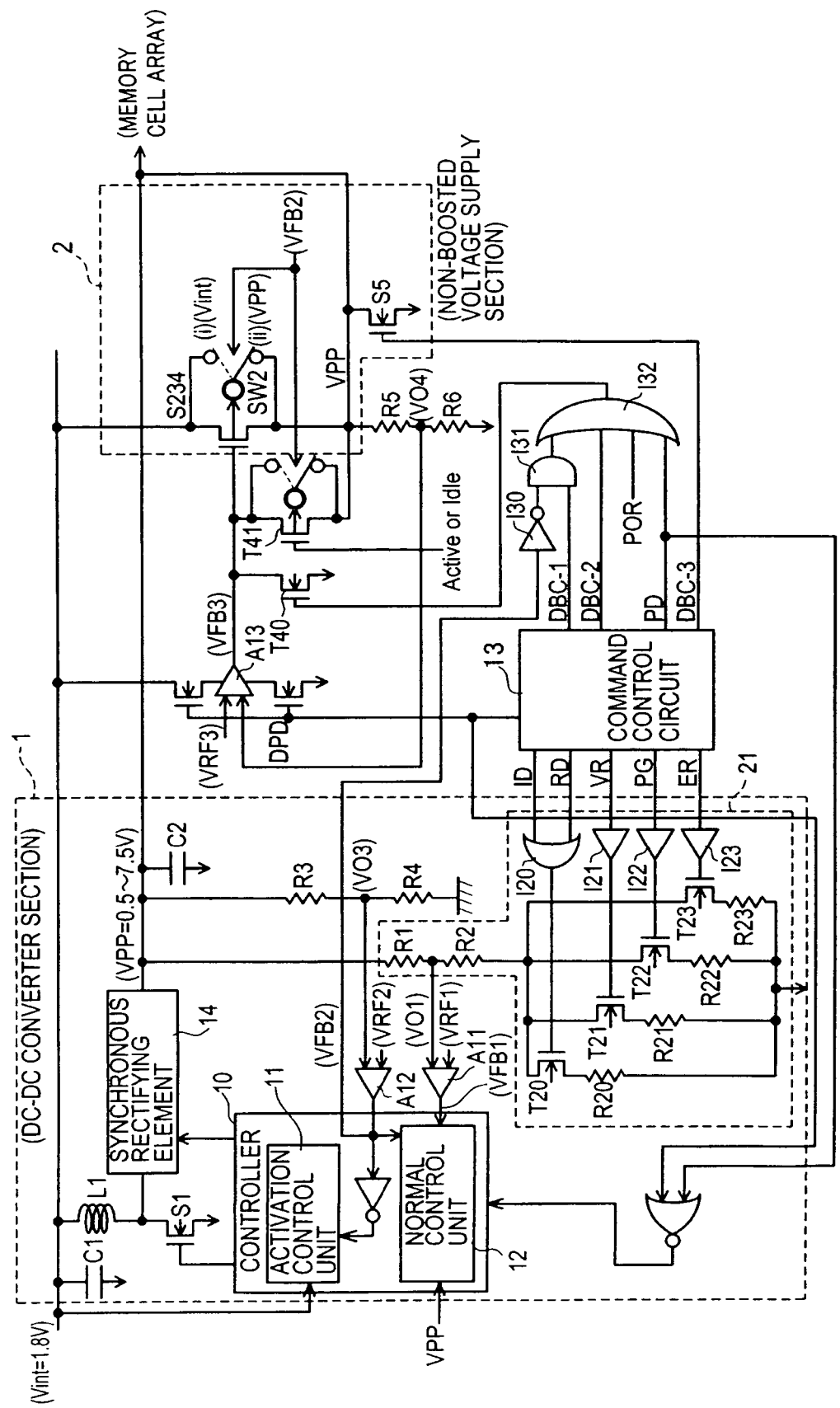
FIG. 5 is a circuit block diagram illustrating a second embodiment.

FIG. 5 illustrates a circuit block diagram. This circuit block diagram includes, in addition to the components of the circuit block diagram according to the first embodiment shown in FIG. 1, a voltage setting section 21 for switching the boosted voltage outputted from the DC-DC converter section 1 to a specified voltage value each time an operation mode is changed.

The voltage outputted from the DC-DC converter section 1 is set by the command control circuit 13. The command control circuit 13 outputs a mode signal indicative of the readout mode, verify read mode, programming mode or erase mode which are the operational modes of the memory or an idle mode signal indicative of the idle mode. Of these modes, the readout mode, verify read mode, programming mode and erase mode indicate that the memory cell array is being accessed. The idle mode indicates a wait state in which a request for an access to the memory cell array is awaited. The idle mode signal ID is outputted in the idle mode; a readout mode signal RD in the readout mode; a verify read mode signal VR in the verify read mode; a programming mode signal PG in the programming mode and an erase mode signal ER in the erase mode.

The voltage setting section 21 includes resistor elements R1, R2 and R20 to R23 which divide the boosted voltage VPP outputted to the internal bias line. The boosted voltage VPP is inputted to one end of the resistor element R1. The other end of the resistor element R1 is connected to one end of the resistor element R2. A switching transistor T20/resistor element R20 through a switching transistor T23/resistor element R23 are respectively connected in series between the other end of the resistor element R2 and the ground voltage. The outputs of the logic gates l20 to l23 to which the mode signal is inputted are connected to the switching transistors T20 to T23.

The resistor elements R20 to R23 have different resistance values which are added to the resistor element R2 in accordance with the conduction control of the switching transistors T20 to T23. The boosted voltage VPP is divided according to the ratio between the resistance values of the resistor elements R1 and R2. Thereby, the feedback voltage V01 outputted from the junction between the resistor elements R1 and R2 becomes a voltage having a split ratio according to conducting one of switching transistors T20 to T23. As the resistance values of the resistor elements R20 to R23 increase, the voltage VFB1 obtained by amplifying the differential voltage of the feedback voltage V01 with respect to the set voltage VRF1 is continuously adjusted to decreasing voltage values.

The setting of the boosted voltage VPP is determined by the logic gates l20 to l23. For instance, the logic gate l20 can set the boosted voltage VPP to 4.0V in the idle mode and the readout mode; the logic gate l21 can set the boosted voltage VPP to 4.5V in the verify read mode; the logic gate 122 can set the boosted voltage VPP to 7.0V in the programming mode; and the logic gate l23 can set the boosted voltage VPP to 7.5V in the erase mode. The consumption current of the DC-DC converter section 1 can be minimized by setting the boosted voltage VPP for the idle mode corresponding to the access wait state to the smallest one (e.g., 4V) of the plurality of boosted voltage VPP values (e.g., 4V to 7.5V) set for the operation modes corresponding to the access operating state.

In addition, by setting the boosted voltage VPP for the idle mode to the set value (e.g., 4.5V) for the readout mode among the plurality of operation modes, the fastest readout speed can be ensured without delaying external access.

Although not shown in the drawings, the voltage setting section may be connected to the side of the set voltage VRF1.

FIG. 6 shows one example of voltage values supplied as the boosted voltage VPP in the respective operation states according to the second embodiment. The following discussion is based on the assumption that 1.8V is supplied as the external voltage Vint. In the idle mode ID and the readout mode RD, the DC-DC converter section 1 is in its active state (ON), whereas the non-boosted voltage supply section 2 is in its inactive state (OFF). 4.0V is supplied as the boosted voltage VPP. In the programming mode PG and the erase mode ER, the DC-DC converter section 1 is in the active state (ON), whereas the non-boosted voltage supply section 2 is in the inactive state (OFF). In the programming mode PG, 7.0V is supplied as the boosted voltage VPP. In the erase mode ER, 7.5V is supplied as the boosted voltage VPP. In the verify mode VR, the DC-DC converter section 1 is in the active state (ON), whereas the non-boosted voltage supply section 2 is in the inactive state (OFF). 4.5V is supplied as the boosted voltage VPP. In the power down mode PD, the DC-DC converter section 1 is in the inactive state (OFF), whereas the non-boosted voltage supply section 2 is in the active state (ON). As the boosted voltage VPP, 1.8V that is equal to the external voltage Vint is supplied. In the deep power down mode DPD, the DC-DC converter section 1 is in the inactive state (OFF), whereas the non-boosted voltage supply section 2 is in the active state (ON). As the boosted voltage VPP, a voltage, which is in the range of 0.5V to 1.0V and lower than the external voltage Vint, is supplied. For reference, one example of the consumption currents of the operation states is shown. In the idle mode ID and the readout mode RD, current consumption is 2 mA to 10 mA. More specifically, the DC-DC converter section in an unloaded condition mainly consumes 2 mA in the idle mode ID of the access wait state. In the readout mode RD of the access operation state, the DC-DC converter section in a loaded condition consumes 10 mA.

In the programming mode PG and the erase mode ER, the DC-DC converter section in a loaded condition consumes a current of 20 to 30 mA. In the verify mode VR, the DC-DC converter section in a loaded condition consumes a current of 12 mA. In the power down state PD, the sub-threshold current consumed by the circuit connected to the boosted voltage VPP is reduced to 5 μA. In the deep power down mode DPD, the sub-threshold current consumed by the circuit connected to the boosted voltage VPP is further reduced to 1 μA.

According to the second embodiment, the feeding control of the boosted voltage VPP in the programming mode or erase mode is performed in succession with the verify read mode. More specifically, during a mode transition from the programming mode or erase mode to the verify read mode, the output signal of the command control is successively switched to PG or ER and then to VR, while the DC-DC converter section being activated, whereby the voltage setting section sequentially switches the output of the boosted voltage VPP to the programming voltage 7.0V or the erase voltage 7.5V and then to the verify read voltage 4.5V. This sequential control continues until all verifying operations are completed and after completion of the verifying operations, the minimum set value or the set value for the readout mode is retrieved. Herein, during a mode transition for downwardly adjusting the output of the DC-DC converter (e.g., a case where the programming voltage 7.0V is switched to the verify read voltage 4.5V), the non-boosted voltage supply section connected to the internal bias line may be simultaneously activated for a specified period of time. More concretely, the P channel transistor S234 of the non-boosted voltage supply section is activated for a specified period of time until a revised voltage value set by the voltage setting section within the DC-DC converter section is supplied (e.g., until the programming voltage 7.0V is switched to the verify read voltage 4.5V), thereby discharging the internal bias line so that its voltage decreases to the primary voltage. Thus, the voltage of the internal bias line can reach a specified value for a mode to be set after a mode transition within a short time, while the large quantity of electric charge of the capacitor element C2 connected to the internal bias line being changed to a specified quantity. Other functions and effects of the DC-DC converter section and the non-boosted voltage supply section than those described above are the same as of the first embodiment (FIG. 1), and therefore an explanation thereof is skipped herein.

Figure 7:
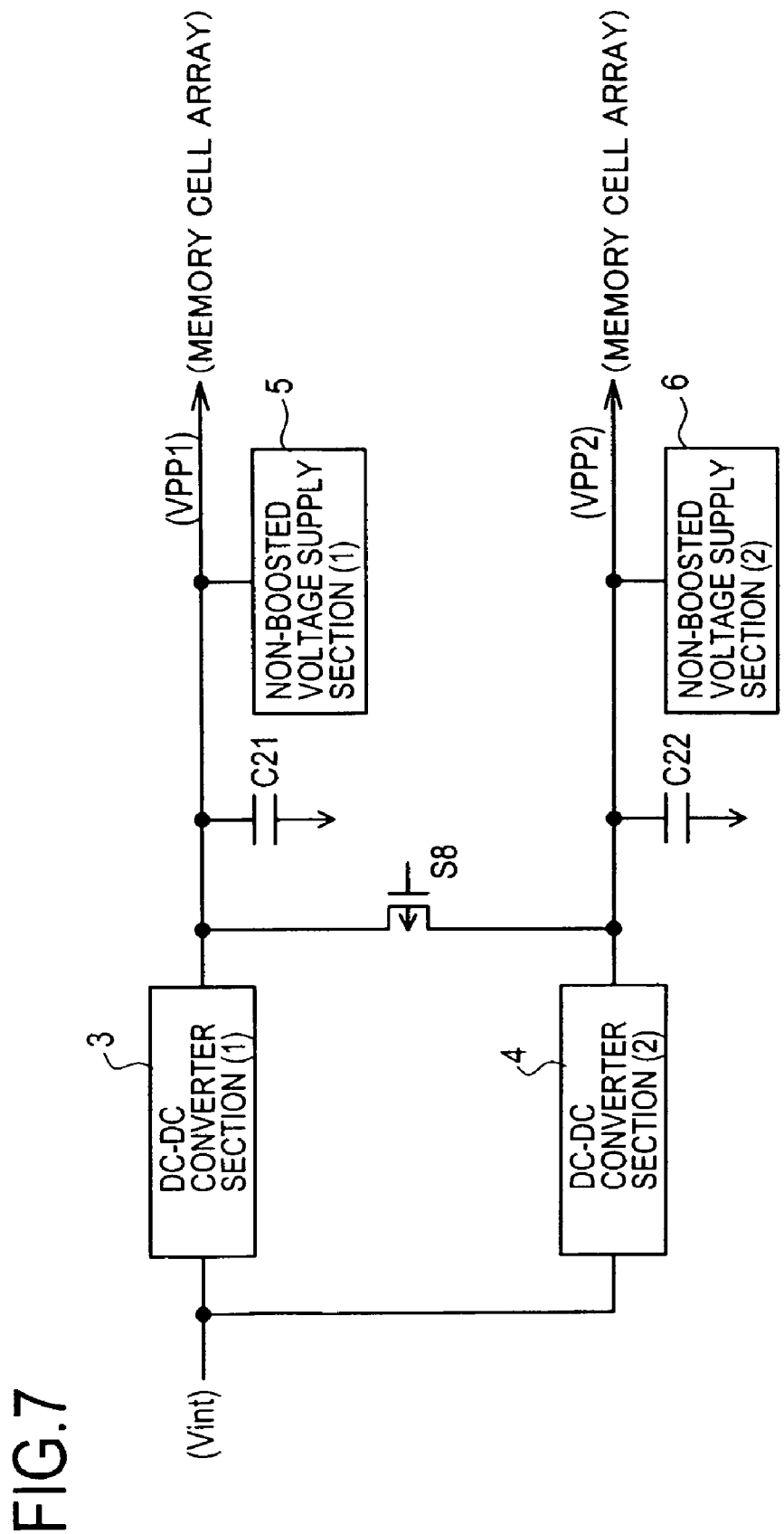
FIG. 7 is a circuit block diagram illustrating a third embodiment.

The third embodiment shown in FIGS. 7, 8 is associated with a case where the memory cell array is constituted by non-volatile memories; boosted voltages classified into two groups VPP1, VPP2 are supplied for biasing the memory cells in the programming, erasing, readout and verify reading operations; and either of them is biased. In one example, the readout voltage and verify read voltage that are associated with external access belong to the second group, whereas the programming voltage and erase voltage that are higher than the second group belong to the first group.

FIG. 7 shows a circuit block diagram. There are provided two DC-DC converter sections (1) 3 and (2) 4 for boosting the external voltage Vint, and two internal bias lines. The boosted voltages VPP1, VPP2 are supplied to their corresponding internal bias lines. The internal bias lines supplied with the boosted voltages VPP1, VPP2 have capacitor elements C21, C22 respectively and non-boosted voltage supply sections (1) 5, (2) 6 respectively. The functions and effects of the DC-DC converter sections and the non-boosted voltage supply sections are the same as those of the first embodiment (FIG. 1) and therefore an explanation of them is skipped herein. Although the DC-DC converter section (1) 3 and the DC-DC converter section (2) 4 are provided independently in FIG. 7, they may be configured to share an inductor element.

The third embodiment is provided with a line switch section S8 connected to the two internal bias lines. The line switch section S8 is constituted by, for example, a P channel transistor. When switching one internal bias line supplied with a boosted voltage from its corresponding DC-DC converter section to the other, the line switch section S8 is brought into its conductive state so that the electric charge of the capacitor element of the internal bias line which has been supplied with a boosted voltage before the switching operation is transferred to the capacitor element of the other internal bias line to be supplied with a boosted voltage after the switching operation. Thereby, the time that elapses until the boosted voltage reaches a specified value as well as current consumption can be reduced, while making it possible to assist the activation of the DC-DC converter section that is to supply a boosted voltage after the switching operation. It should be noted that when the line switch section S8 is non-conductive, the gate of the line switch section S8 is set to higher one of the two boosted voltages. Although not shown in the drawings, the direction of the bias applied to the well that is the back gate of the line switch section S8 is reverse, similarly to the P channel transistor S234 of the first embodiment. In addition, although not shown in the drawings, the line switch section S8 may be constituted by an N channel transistor.

FIG. 8 shows biasing conditions sorted by operation modes. The following description is based on the assumption that 1.8V is supplied as the external voltage Vint. In the idle mode ID and the readout mode RD, the DC-DC converter section (2) 4 and the non-boosted voltage supply section (1) 5 are in the active state (ON), whereas the DC-DC converter section (1) 3 and the non-boosted voltage supply section (2) 6 are in the inactive state (OFF). The boosted voltages VPP1, VPP2 are 0.5V/1.8V and 4.0V, respectively. In the programming mode PG and the erase mode ER, the DC-DC converter section (1) 3 and the non-boosted voltage supply section (2) 6 are in the active state (ON), whereas the DC-DC converter section (2) 4 and the non-boosted voltage supply section (1) 5 are in the inactive state (OFF). The boosted voltages VPP1, VPP2 are 7.0V/7.5V and 0.5V/1.8V, respectively. In the verify mode VR, the DC-DC converter section (2) 4 and the non-boosted voltage supply section (1) 5 are in the active state (ON), whereas the DC-DC converter section (1) 3 and the non-boosted voltage supply section (2) 6 are in the inactive state (OFF). The boosted voltages VPP1, VPP2 are 0.5V/1.8V and 4.0V, respectively. In the power down state PD, the non-boosted voltage supply sections (1) 5, (2) 6 are in the active state (ON), whereas the DC-DC converter sections (1) 3, (2) 4 are in the inactive state (OFF). The boosted voltages VPP1, VPP2 are both 1.8V. In the deep power down state DPD, the non-boosted voltage supply sections (1) 5, (2) 6 are in the active state (ON), whereas the DC-DC converter sections (1) 3, (2) 4 are in the inactive state (OFF). The boosted voltages VPP1, VPP2 are both 0.5V.

An operation sequence for switching one internal bias line to which a boosted voltage is supplied to the other is shown. When switching from the supply of the boosted voltage VPP1 to the supply of the boosted voltage VPP2, the line switch section S8 becomes conductive after the DC-DC converter section (1) 3 has been suspended. The electric charge built up in the capacitor element C21 is transferred to the capacitor element C22. Owing to the transfer of electric charge, the initial value of the boosted voltage VPP2 rises. Thereafter, the DC-DC converter section (2) 4 starts operation. Switching from the supply of the boosted voltage VPP2 to the supply of the boosted voltage VPP1 is similarly done by electric charge transfer before the operation of the DC-DC converter section (1) 3 starts. In one application of the third embodiment, it is beneficial to activate the line switch section for a specified period of time with the first and second systems (i.e., the two DC-DC converter sections, two internal bias lines and others) being both activated. For instance, in a mode transition from the programming mode to the verify mode, the DC-DC converter section (1) 3 of the first system is continuously activated until the DC-DC converter section (2) 4 of the second system becomes active and the boosted voltage VPP2 reaches the proximity of a specified voltage value. Thereby, the electric charge of the capacitor element C21 of the first system assists the DC-DC converter section (2) 4 of the second system, while the boosted voltage VPP2 reaches the proximity of the specified voltage at high speed thanks to both the first DC-DC converter section (1) 3 that is continuously operated and the second DC-DC converter section (2) 4. This can be explained by the fact that the current drive capability of the continuously operating DC-DC converter is much higher than that of the DC-DC converter that is starting operation.

Embodiments of the present claimed subject matter generally relates to semiconductor devices. More particularly, embodiments allow semiconductor devices to function with increased efficiency. In one implementation, the claimed subject matter is applicable to flash memory and devices that utilize flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Examplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive nagivation devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones.).

Flash memory stores information in an array of floating gate transistors, called "cells", each of which traditionally stores one bit of information. However, newer flash memory devices, such as MirrorBit Flash Technology from Spansion Inc., can store more than 1 bit per cell. The MirrorBit cell doubles the intrinsic density of a Flash memory array by storing two physically distinct bits on opposite sides of a memory cell. Each bit serves as a binary bit of data (e.g., either 1 or 0) that is mapped directly to the memory array. Reading or programming one side of a memory cell occurs independently of whatever data is stored on the opposite side of the cell.

With regards to wireless markets, flash memory that utilizes MirrorBit technology has several key advantages. For example, flash memory that utilizes MirrorBit technology are capable of burst-mode access as fast as 80 MHz, page access times as fast as 25 ns, simultaneous read-write operation for combined code and data storage, and low standby power (e.g., 1 µA).

Figure 9:
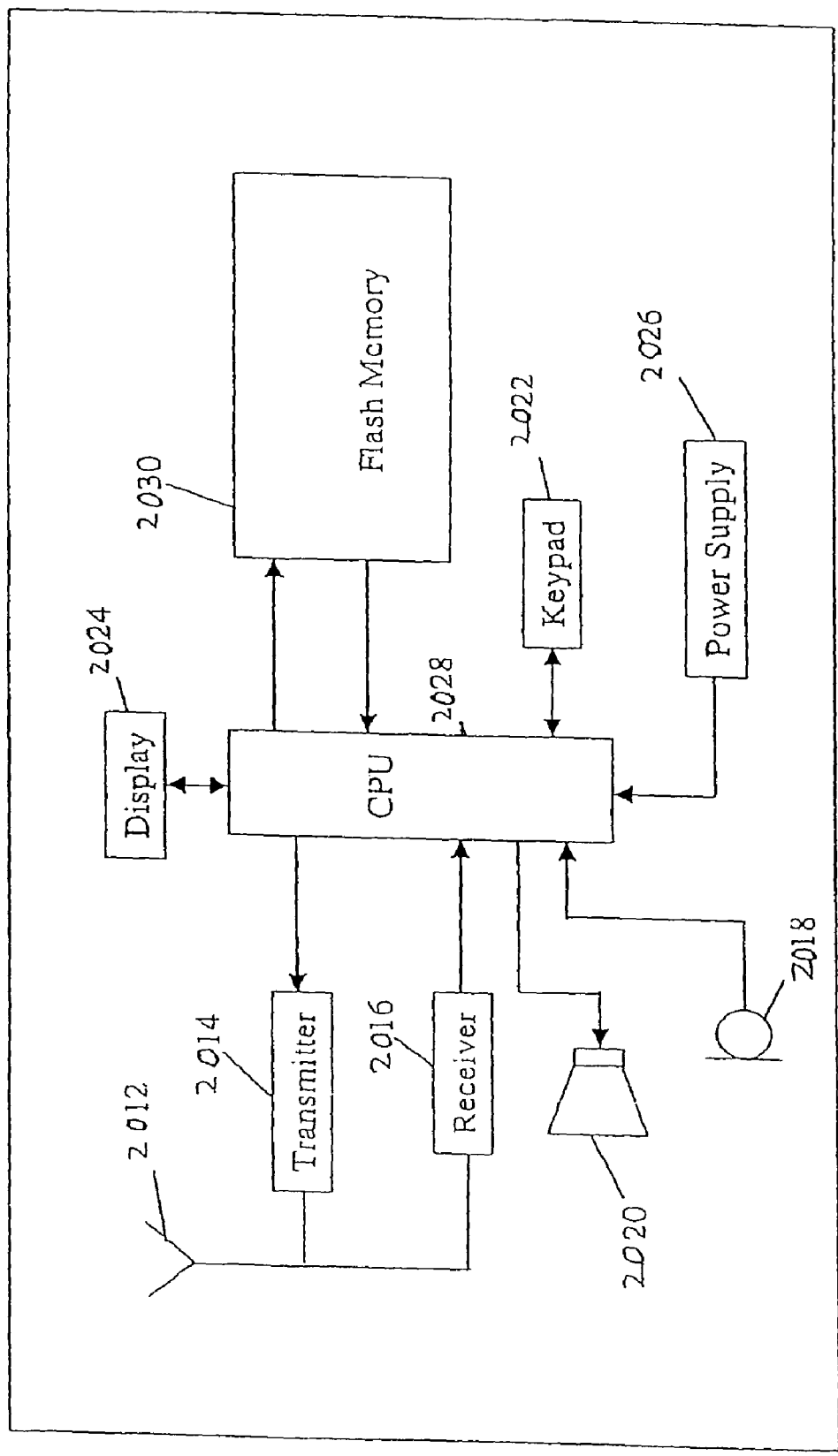
FIG. 9 illustrates a block diagram of a conventional portable phone, upon which embodiments can be implemented.

FIG. 9 shows a block diagram of a conventional portable telephone 2010 (a.k.a. cell phone, cellular phone, mobile phone, internet protocol phone, wireless phone, etc.), upon which embodiments can be implemented. The cell phone 2010 includes an antenna 2012 coupled to a transmitter 2014 a receiver 2016, as well as, a microphone 2018, speaker 2020, keypad 2022, and display 2024. The cell phone 2010 also includes a power supply 2026 and a central processing unit (CPU) 2028, which may be an embedded controller, conventional microprocessor, or the like. In addition, the cell phone 2010 includes integrated, flash memory 2030. Flash memory 2030 includes: a memory cell array; an internal bias line which supplies a bias voltage to the memory cell array; a DC-DC converter section having an output line coupled to the internal bias line, the DC-DC converter section boosting an external voltage to supply a boosted voltage to the output line thereof; and a non-boosted voltage supply section having an output line coupled to the internal bias line for supplying a non-boosted voltage equal to or less than the external voltage to the output line thereof, wherein the non-boosted voltage supply section does not supply the non-boosted voltage to its output line when the internal bias line is maintained at the boosted voltage, and wherein the DC-DC converter section does not supply the boosted voltage to its output line when the internal bias line is maintained at the non-boosted voltage. In this way, embodiments efficiently reduces overall electric power consumption. This improvement can translate into power consumption efficiency for various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones.

Flash memory comes in two primary varieties, NOR-type flash and NAND-type flash. While the general memory storage transistor is the same for all flash memory, it is the interconnection of the memory cells that differentiates the designs. In a conventional NOR-type flash memory, the memory cell transistors are connected to the bit lines in a parallel configuration, while in a conventional NAND-type flash memory, the memory cell transistors are connected to the bit lines in series. For this reason, NOR-type flash is sometimes referred to as "parallel flash" and NAND-type flash is referred to as "serial flash."

Traditionally, portable phone (e.g., cell phone) CPUs have needed only a small amount of integrated NOR-type flash memory to operate. However, as portable phones (e.g., cell phone) have become more complex, offering more features and more services (e.g., voice service, text messaging, camera, ring tones, email, multimedia, mobile TV, MP3, location, productivity software, multiplayer games, calendar, and maps.), flash memory requirements have steadily increased. Thus, a more efficient flash memory will render a portable phone more competitive in the telecommunications market.

Also, as mentioned above, flash memory is applicable to a variety of devices other than portable phones. For instance, flash memory can be utilized in personal digital assistants, set-top boxes, digital video recorders, networking and telecommunication equipments, printers, computer peripherals, automotive navigation devices, and gaming systems.

Figure 10:
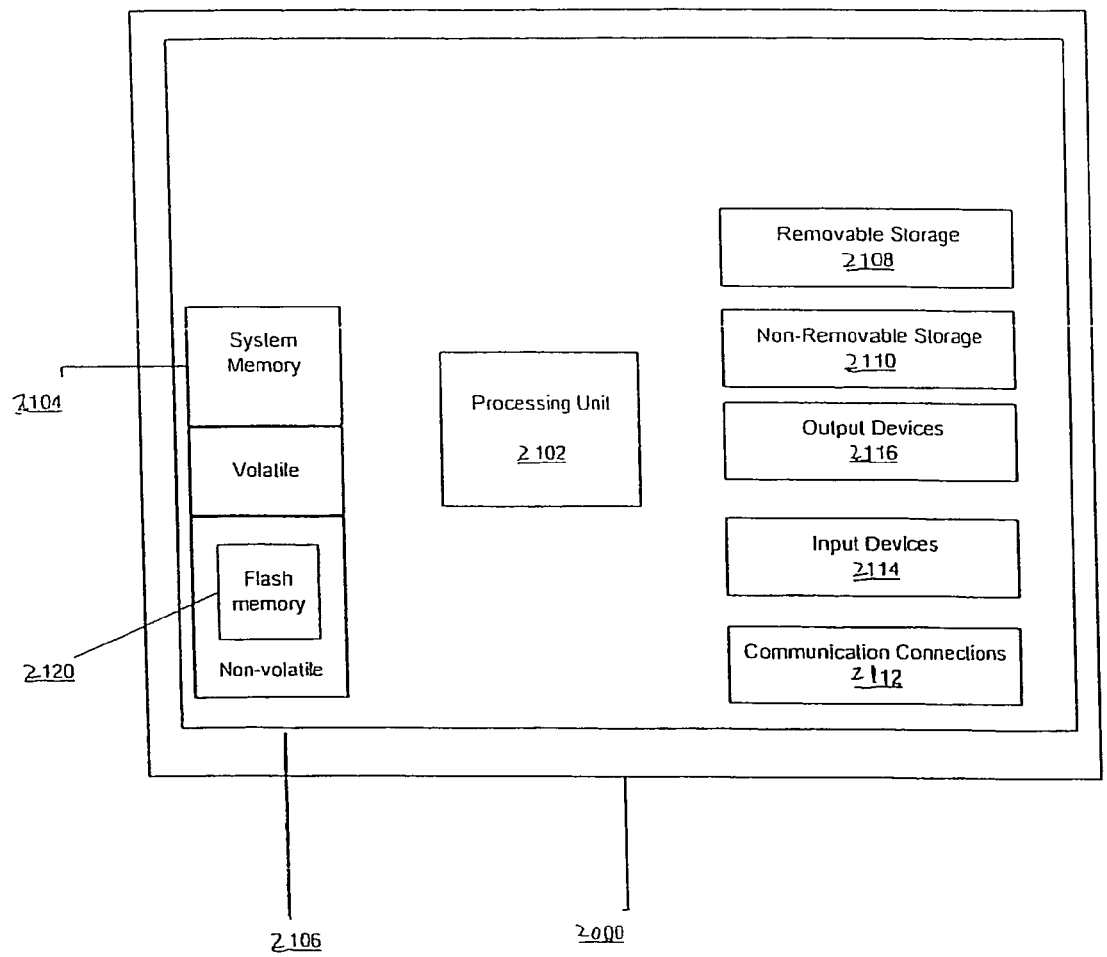
FIG. 10 illustrates a block diagram of a computing device, upon which embodiments of the present claimed subject matter can be implemented.

FIG. 10 illustrates a block diagram of a computing device 2100, upon which embodiments of the present claimed subject matter can be implemented. Although computing device 2100 is shown and described in FIG. 10 as having certain numbers and types of elements, the embodiments are not necessarily limited to the exemplary implementation. That is, computing device 2100 can include elements other than those shown, and can include more than one of the elements that are shown. For example, computing device 2100 can include a greater number of processing units than the one (processing unit 2102) shown. Similarly, in another example, computing device 2100 can include additional components not shown in FIG. 10.

Also, it is important to note that the computing device 2100 can be a variety of things. For example, computing device 2100 can be but are not limited to a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks. This is important as small computing devices are often moved around and encounters frequent physical impacts. Also, flash memory is more able than other types of memory to withstand intense physical pressure and/or heat. And thus, portable computing devices are able to be used in a greater range of environmental variables.

In its most basic configuration, computing device 2100 typically includes at least one processing unit 2102 and memory 2104. Depending on the exact configuration and type of computing device, memory 2104 may be volatile (such as RAM), non-volatile (such as ROM, flash memory, etc.) or some combination of the two. This most basic configuration of computing device 2100 is illustrated in FIG. 10 by line 2106. Additionally, device 2100 may also have additional features/functionality. For example, device 2100 may also include additional storage (removable and/or non-removable) including, but not limited to, magnetic or optical disks or tape. In one example, in the context of a gaming system, the removable storage could a game cartridge receiving component utilized to receive different game cartridges. In another example, in the context of a Digital Video Disc (DVD) recorder, the removable storage is a DVD receiving component utilized to receive and read DVDs. Such additional storage is illustrated in FIG. 10 by removable storage 2108 and non-removable storage 2110. Computer storage media includes volatile and nonvolatile, removable and non-removable media implemented in any method or technology for storage of information such as computer readable instructions, data structures, program modules or other data. Memory 2104, removable storage 2108 and non-removable storage 2110 are all examples of computer storage media. Computer storage media includes, but is not limited to, RAM, ROM, EEPROM, flash memory 2120 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 2100. Any such computer storage media may be part of device 2100.

In the present embodiment, the flash memory 2120 comprises: a memory cell array; an internal bias line which supplies a bias voltage to the memory cell array; a DC-DC converter section having an output line coupled to the internal bias line, the DC-DC converter section boosting an external voltage to supply a boosted voltage to the output line thereof; and a non-boosted voltage supply section having an output line coupled to the internal bias line for supplying a non-boosted voltage equal to or less than the external voltage to the output line thereof, wherein the non-boosted voltage supply section does not supply the non-boosted voltage to its output line when the internal bias line is maintained at the boosted voltage, and wherein the DC-DC converter section does not supply the boosted voltage to its output line when the internal bias line is maintained at the non-boosted voltage. In this way, embodiments efficiently reduces overall electric power consumption. This improvement can translate into power consumption efficiency for various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones.

Further, in one embodiment, the flash memory 2120 utilizes mirrorbit technology to allow storing of two physically distinct bits on opposite sides of a memory cell.

Device 2100 may also contain communications connection(s) 2112 that allow the device to communicate with other devices. Communications connection(s) 2112 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. The term computer readable media as used herein includes both storage media and communication media.

Device 2100 may also have input device(s) 2114 such as keyboard, mouse, pen, voice input device, game input device (e.g., a joy stick, a game control pad, and/or other types of game input device), touch input device, etc. Output device(s) 2116 such as a display (e.g., a computer monitor and/or a projection system), speakers, printer, network peripherals, etc., may also be included. All these devices are well know in the art and need not be discussed at length here.

Aside from mobile phones and portable computing devices, flash memory is also widely used in portable multimedia devices, such as portable music players. As users would desire a portable multimedia device to have as large a storage capacity as possible, an increase in memory density would be advantageous. Also, users would also benefit from reduced memory read time.

Figure 11:
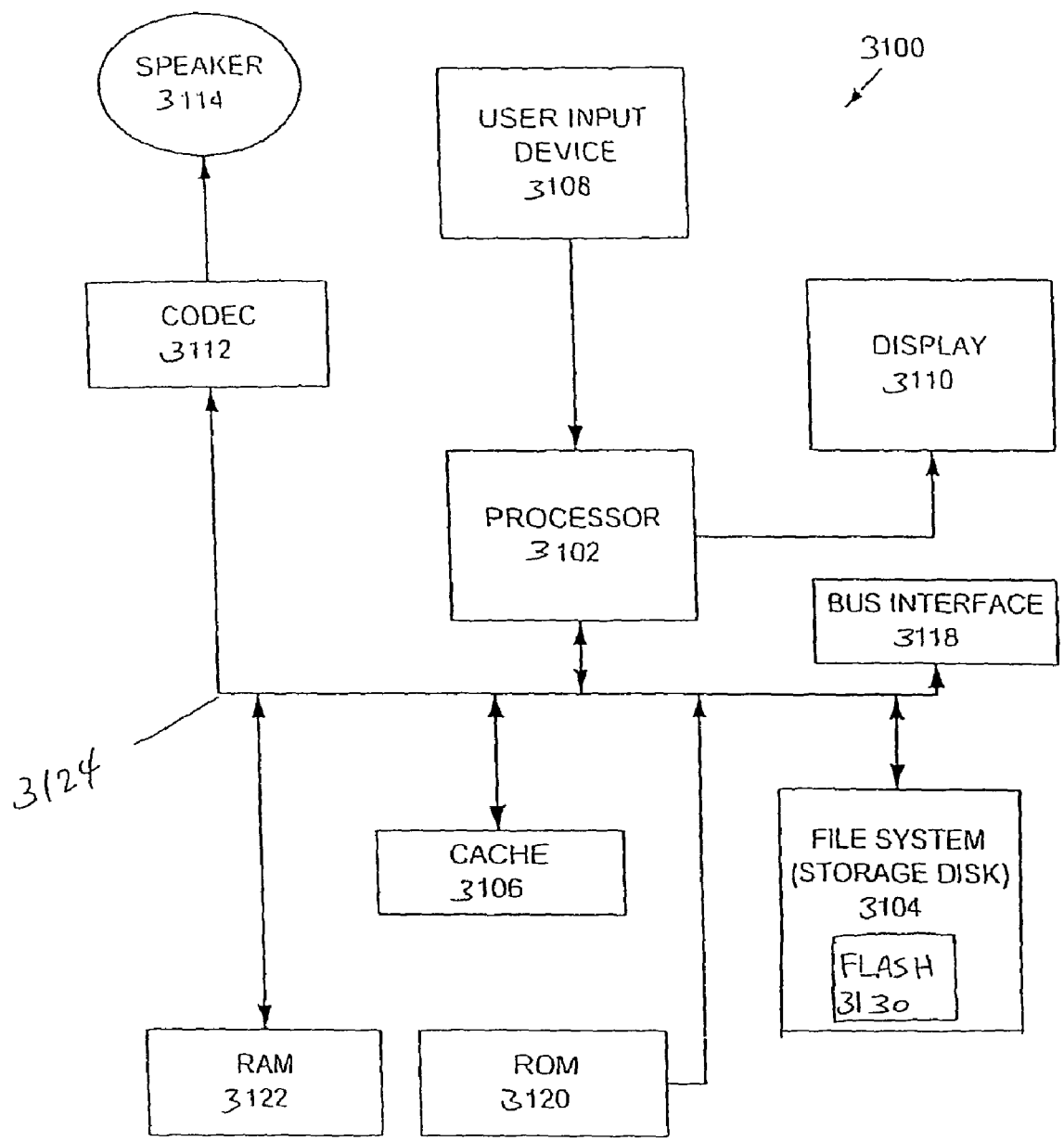
FIG. 11 illustrates an exemplary portable multimedia device, or media player, in accordance with an embodiment of the present claimed subject matter.

FIG. 11 shows an exemplary portable multimedia device, or media player, 3100 in accordance with an embodiment of the invention. The media player 3100 includes a processor 3102 that pertains to a microprocessor or controller for controlling the overall operation of the media player 3100. The media player 3100 stores media data pertaining to media assets in a file system 3104 and a cache 3106. The file system 3104 is, typically, a storage disk or a plurality of disks. The file system 3104 typically provides high capacity storage capability for the media player 3100. Also, file system 3104 includes flash memory 3130. In the present embodiment, the flash memory 3130 comprises: a memory cell array; an internal bias line which supplies a bias voltage to the memory cell array; a DC-DC converter section having an output line coupled to the internal bias line, the DC-DC converter section boosting an external voltage to supply a boosted voltage to the output line thereof; and a non-boosted voltage supply section having an output line coupled to the internal bias line for supplying a non-boosted voltage equal to or less than the external voltage to the output line thereof, wherein the non-boosted voltage supply section does not supply the non-boosted voltage to its output line when the internal bias line is maintained at the boosted voltage, and wherein the DC-DC converter section does not supply the boosted voltage to its output line when the internal bias line is maintained at the non-boosted voltage. In this way, embodiments efficiently reduces overall electric power consumption. This improvement can translate into power consumption efficiency for various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones.

However, since the access time to the file system 3104 is relatively slow, the media player 3100 can also include a cache 3106. The cache 3106 is, for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3106. The power consumption is particularly important when the media player 3100 is a portable media player that is powered by a battery (not shown). The media player 3100 also includes a RAM 3120 and a Read-Only Memory (ROM) 3122. The ROM 3122 can store programs, utilities or processes to be executed in a non-volatile manner. The RAM 3120 provides volatile data storage, such as for the cache 3106.

The media player 3100 also includes a user input device 3108 that allows a user of the media player 3100 to interact with the media player 3100. For example, the user input device 3108 can take a variety of forms, such as a button, keypad, dial, etc. Still further, the media player 3100 includes a display 3110 (screen display) that can be controlled by the processor 3102 to display information to the user. A data bus 3124 can facilitate data transfer between at least the file system 3104, the cache 3106, the processor 3102, and the CODEC 3110. The media player 3100 also includes a bus interface 3116 that couples to a data link 3118. The data link 3118 allows the media player 3100 to couple to a host computer.

In one embodiment, the media player 3100 serves to store a plurality of media assets (e.g., songs) in the file system 3104. When a user desires to have the media player play a particular media item, a list of available media assets is displayed on the display 3110. Then, using the user input device 3108, a user can select one of the available media assets. The processor 3102, upon receiving a selection of a particular media item, supplies the media data (e.g., audio file) for the particular media item to a coder/decoder (CODEC) 3110. The CODEC 3110 then produces analog output signals for a speaker 3114. The speaker 3114 can be a speaker internal to the media player 3100 or external to the media player 3100. For example, headphones or earphones that connect to the media player 3100 would be considered an external speaker.

For example, in a particular embodiment, the available media assets are arranged in a hierarchical manner based upon a selected number and type of groupings appropriate to the available media assets. For example, in the case where the media player 3100 is an MP3 type media player, the available media assets take the form of MP3 files (each of which corresponds to a digitally encoded song or other audio rendition) stored at least in part in the file system 3104. The available media assets (or in this case, songs) can be grouped in any manner deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on.

Figure 12:
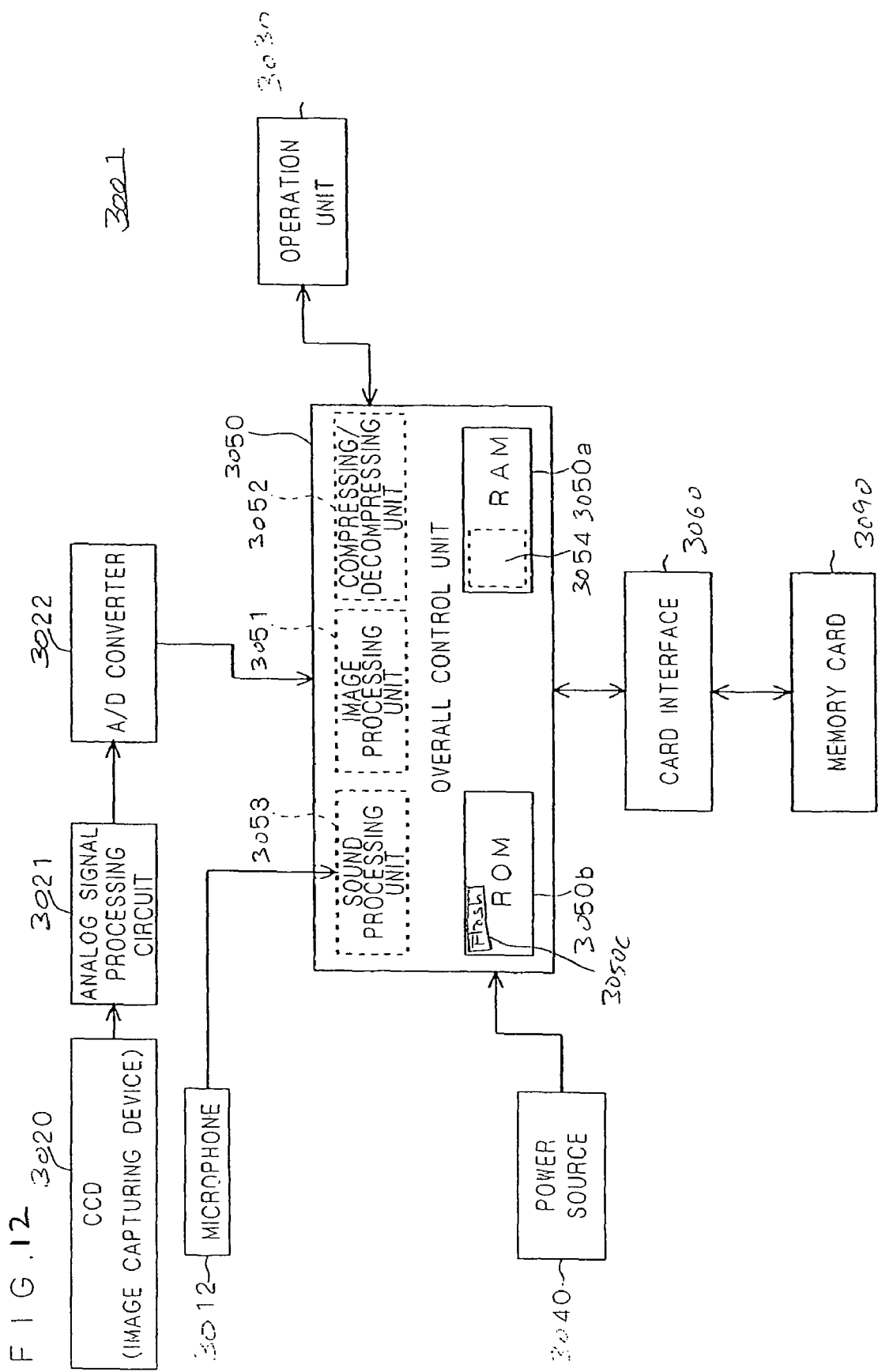
FIG. 12 illustrates an exemplary digital camera, in accordance with an embodiment of the present claimed subject matter.

Referring to FIG. 12, the internal configuration of a digital camera 3001 is described. FIG. 12 is a block diagram showing the internal functions of the digital camera 3001. The CCD (image capturing device) 3020 functions as image capturing means for capturing a subject image and generating an electronic image signal and has, for example, 1600 times 1200 pixels. The CCD 3020 photoelectrically converts a light image of the subject formed by the taking lens into image signals (signal made of a signal sequence of pixel signals received by the pixels) of R (red), G (green) and B (blue) pixel by pixel and outputs the image signal.

The image signal obtained from the CCD 3020 is supplied to an analog signal processing circuit 3021. In the analog signal processing circuit 3021, the image signal (analog signal) is subjected to a predetermined analog signal process. The analog signal processing circuit 3021 has a correlated double sampling circuit (CDS) and an automatic gain control circuit (AGC) and adjusts the level of the image signal by performing a process of reducing noise in the image signal by the correlated double sampling circuit and adjusting the gain by the automatic gain control circuit.

An A/D converter 3022 converts each of pixel signals of the image signal into a digital signal of 12 bits. The digital signal obtained by the conversion is temporarily stored as image data in a buffer memory 3054 in a RAM 3050a. The image data stored in the buffer memory 3054 is subjected to WB (white balance) process, gamma correction process, color correction process and the like by an image processing unit 3051 and, after that, the processed signal is subjected to a compressing process or the like by a compressing/decompressing unit 3052.

A sound signal obtained from the microphone 3012 is inputted to a sound processing unit 3053. The sound signal inputted to the sound processing unit 3053 is converted into a digital signal by an A/D converter (not shown) provided in the sound processing unit 3053 and the digital signal is temporarily stored in the buffer memory 3054.

An operation unit is an operation unit that can include a power source button and a shutter release button and is used when the user performs an operation of changing a setting state of the digital camera 3001 and an image capturing operation.

A power source 3040 is a power supply source of the digital camera 3001. The digital camera 3001 is driven by using a secondary battery such as a lithium ion battery as the power source battery BT.

An overall control unit 3050 is constructed by a microcomputer having therein the RAM 3050a and a ROM 3050b. When the microcomputer executes a predetermined program, the overall control unit 3050 functions as a controller for controlling the above-described components in a centralized manner. The overall control unit 3050 also controls, for example, a live view display process and a process of recording data to a memory card. The RAM 3050a is a semiconductor memory (such as DRAM) which can be accessed at high speed and the ROM 3050b takes the form of, for example, an electrically-rewritable nonvolatile semiconductor memory (such as flash ROM 3050c). A flash memory, in one embodiment, includes: a memory cell array; an internal bias line which supplies a bias voltage to the memory cell array; a DC-DC converter section having an output line coupled to the internal bias line, the DC-DC converter section boosting an external voltage to supply a boosted voltage to the output line thereof; and a non-boosted voltage supply section having an output line coupled to the internal bias line for supplying a non-boosted voltage equal to or less than the external voltage to the output line thereof, wherein the non-boosted voltage supply section does not supply the non-boosted voltage to its output line when the internal bias line is maintained at the boosted voltage, and wherein the DC-DC converter section does not supply the boosted voltage to its output line when the internal bias line is maintained at the non-boosted voltage. In this way, embodiments efficiently reduces overall electric power consumption. This improvement can translate into power consumption efficiency for various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones.

An area as a part of the RAM 3050a functions as a buffer area for temporary storing data. This buffer area is referred to as the buffer memory 3054. The buffer memory 3054 temporarily stores image data and sound data.

The overall control unit 3050 has the image processing unit 3051, compressing/decompressing unit 3052 and sound processing unit 3053. The processing units 3051, 3052 and 3053 are function parts realized when the microcomputer executes a predetermined program.

The image processing unit 3051 is a processing unit for performing various digital imaging processes such as WB process and gamma correcting process. The WB process is a process of shifting the level of each of the color components of R, G and B and adjusting color balance. The gamma correcting process is a process of correcting the tone of pixel data. The compressing/decompressing unit 3052 is a processing unit for performing an image data compressing process and an image data decompressing process. As the compressing method, for example, the JPEG method is employed. The sound processing unit 3053 is a processing unit for performing various digital processes on sound data.

A card interface (I/F) 3060 is an interface for writing/reading image data to/from the memory card 3090 inserted into the insertion port in the side face of the digital camera 1. At the time of reading/writing image data from/to the memory card 3090, the process of compressing or decompressing image data is performed according to, for example, the JPEG method in the compressing/decompressing unit 3052, and image data is transmitted/received between the buffer memory 3054 and the memory card 3090 via the card interface 3060. Also at the time of reading/writing sound data, sound data is transmitted/received between the buffer memory 3054 and the memory card 3090 via the card interface 3060.

Further, by using the card interface 3060, the digital camera 3001 transmits/receives data such as an image and sound and, in addition, can load a program which operates on the digital camera 3001. For example, a control program recorded on the memory card 3090 can be loaded into the RAM 3050a or ROM 3050b of the overall control unit 3050. In such a manner, the control program can be updated.

Also by communication with an external device (such as an external computer) via a USB terminal, various data such as an image and sound and a control program can be transmitted/received. For example, various data, a program, and the like recorded on a recording medium (CD-R/RW or CD-ROM) which is set into a reader (optical drive device or the like) of the external computer can be obtained via the USB terminal.

It is apparent from the foregoing description that, according to the embodiments of the invention, in the period during which a boosted voltage is supplied to the internal bias line, the DC-DC converter section is put in operation to ensure sufficient power supply ability and in the period during which a non-boosted voltage is supplied to the internal bias line, the DC-DC converter section is kept in its inactive state. Thus, in the period during which the supply of a boosted voltage is unnecessary, power consumption by the DC-DC converter section or power consumption caused by generation of a boosted voltage can be prevented, which leads to a reduction in overall power consumption.

In addition, in the course of supplying the internal bias line with a boosted voltage subsequently to activation of the DC-DC converter section, the non-voltage supply section performs voltage supply operation to prior supply power to the internal bias line. This assists the DC-DC converter section and, at the same time, makes it possible to reduce the time that elapses from the start-up of the DC-DC converter section until the voltage at the internal bias line reaches the boosted voltage value, so that the access operation can be speeded up.

It is obvious that the invention is not necessarily limited to the particular embodiments shown herein and various changes and modifications may be made to the disclosed embodiments without departing from the spirit and scope of the invention.

There are various final forms for the systems to which the invention is applied. For instance, one device is such that the DC-DC converter section, the non-boosted voltage supply section and its control unit, the command control circuit and the memory cell array etc. are all incorporated in a single silicon bulk. In another device, the DC-DC converter section is incorporated in a single silicon bulk, whereas the non-boosted voltage supply section and its control unit, the command control circuit and the memory cell array etc. are incorporated in another silicon bulk and these silicon bulks are mounted on a single package. There is also a system in which the DC-DC converter section in a silicon bulk is mounted on a package, whereas the non-boosted voltage supply section and its control unit, the command control circuit and the memory cell array etc. in another silicon bulk are mounted on another package, and these packages are mounted on a system substrate.

"The memory cell array etc." indicates an active or passive circuit that functions as a memory and includes memory cells, logic circuits used for extensively accessing the memory cells, driving circuits, differential amplifiers, decoders and the like.

What is claimed is:

1. A storage device including:
   a memory cell array;
   an internal bias line which supplies a bias voltage to the memory cell array;
   a DC-DC converter section having an output line coupled to the internal bias line, the DC-DC converter section boosting an external voltage to supply a boosted voltage to the output line thereof; and
   a non-boosted voltage supply section having an output line coupled to the internal bias line for supplying a non-boosted voltage equal to or less than the external voltage to the output line thereof,
   wherein the non-boosted voltage supply section does not supply the non-boosted voltage to its output line when the internal bias line is maintained at the boosted voltage, wherein the DC-DC converter section does not supply the boosted voltage to its output line when the internal bias line is maintained at the non-boosted voltage, and wherein the non-boosted voltage supply section supplies the non-boosted voltage to the internal bias line before activation of the DC-DC converter and after activation of the DC-DC converter until the internal bias line reaches the boosted voltage.

2. The storage device according to claim 1, wherein the non-boosted voltage supply section comprises a first switching section that couples an external voltage line to which the external voltage is supplied to the internal bias line.

3. The storage device according to claim 2, wherein the first switching section is energized to couple the external voltage line to the internal bias line before activation of the DC-DC converter and after activation of the DC-DC converter until the internal bias line reaches the boosted voltage.

4. The storage device according to claim 2, wherein the first switching section is energized to couple the external voltage line to the internal bias line after suspension of voltage supplying by the DC-DC converter section while the internal bias line is set to the non-boosted voltage.

5. The storage device according to claim 2, further comprising a plurality of operation modes in which different voltages are applied to the internal bias line, and
   wherein the first switching section is energized to couple the external voltage line to the internal bias line in response to a transition from one of the operation modes to another one of the operation modes.

6. The storage device according to claim 1, wherein the non-boosted voltage supply section comprises a second switching section that couples the internal bias line to a ground line, and
   wherein the second switching section is energized to couple the ground line to the internal bias line after suspension of voltage supplying by the DC-DC converter section while the non-boosted voltage is set lower than the external voltage.

7. The storage device according to claim 6, wherein the second switching section is energized by pulse driving.

8. The storage device according to claim 2, wherein the non-boosted voltage supply section further comprises a second switching section that couples the internal bias line to a ground line, and
   wherein the second switching section is energized to couple the ground line to the internal bias line following energizing the first switching section after suspension of voltage supplying by the DC-DC converter when the non-boosted voltage is set lower than the external voltage.

9. The storage device according to claim 1, wherein the internal bias line is a power voltage source line of the memory cell array, and wherein in an active state the DC-DC converter supplies a power source voltage as the boosted voltage, and in a stand-by state the non-boosted voltage supply section supplies a power source voltage as the non-boosted voltage.

10. The storage device according to claim 1, wherein the memory cell array is a nonvolatile memory cell array having operational states comprising a program operation, an erase operation and a read operation, and wherein the DC-DC converter section supplies the boosted voltage as a bias voltage to the internal bias line in at least one of the operational states, and wherein the non-boosted voltage supply section supplies the non-boosted voltage as a bias voltage to the internal bias line in a stand-by state.

11. The storage device according to claim 10, wherein the DC-DC converter comprises a voltage setting section which sets a predetermined voltage value as the boosted voltage for each of the operational states.

12. The storage device according to claim 11, wherein the read operation is a verify read operation and the voltage setting section changes the predetermined voltage value with the DC-DC converter section activated, during transition of the operational states between the program operation or the erase operation and the verify read operation.

13. The storage device according to claim 12, wherein the DC-DC converter further comprises a first switching section which connects an external voltage line and the internal bias line, and wherein the first switching section is energized for a predetermined time during the transition of the operational states.

14. The storage device according to claim 11, wherein the voltage setting section sets a lowest voltage value of the predetermined voltage values in the program operation, the erase operation and the read operation, in an idle state of supply voltage being supplied, the state in which the program operation, the erase operation or the read operation is inactive.

15. The storage device according to claim 11, wherein the predetermined voltage value during an idle state is equivalent to the predetermined voltage value during the read operation.

16. The storage device according to claim 1, wherein the internal bias line comprises two or more internal bias lines to which different bias voltages are supplied, the storage device further comprising a line switching section coupled to the two or more internal bias lines, wherein the line switching section is energized to connect a first one of the internal bias lines to a second one of the internal lines, after suspension of or while supplying the bias voltage to the first one of the internal bias lines, before and/or after start of supplying the bias voltage to the second one of internal bias lines, and before the second one of the internal bias lines reaches a target bias voltage.

17. A method for controlling a storage device that supplies either a boosted voltage resulting from an external voltage or a non-boosted voltage whose value is equal to or less than the external voltage to an internal bias line in a memory cell array, the method comprising the steps of;
suspending generation of the non-boosted voltage when maintaining the internal bias line at the boosted voltage;
suspending generation of the boosted voltage when maintaining the internal bias line is maintained at the non-boosted voltage; and
supplying the non-boosted voltage to the internal bias line until the internal bias line reaches the boosted voltage when supplying the boosted voltage to the internal bias line.

18. The method for controlling a storage device according to claim 17, further comprising the step of supplying the external voltage to the internal bias line when supplying the non-boosted voltage to the internal bias line.

19. The method for controlling a storage device according to claim 18, further comprising the step of supplying a ground voltage to the internal bias line when supplying the non-boosted voltage to the internal bias line.

20. The method for controlling a storage device according to claim 17, wherein the memory cell array is a nonvolatile memory cell array, and wherein the boosted voltage is a bias voltage in one of the operation modes of program operation, erase operation, or read operation, and wherein predetermined voltage values are set for each of the operation modes.

21. The method for controlling a storage device according to claim 20, wherein the read operation is a verify read operation, and wherein during transition of the operation modes between the program operation or the erase operation and the verify read operation, a predetermined voltage value is set in accordance with the operation modes while generation of the boosted voltage is maintained.

22. The method for controlling a storage device according to claim 21, further comprising the step of supplying the external voltage for a predetermined time during transition of the operation mode in order to cause the transition of predetermined voltage value of the boosted voltage.

23. The method for controlling a storage device according to claim 20, wherein the boosted voltage is maintained at a lowest voltage value of the predetermined voltage values, in an idle state of supply voltage being supplied, the state in which the program operation, the erase operation or the read operation is inactive.

24. The method for controlling a storage device according to claim 23, wherein the predetermined voltage value during the idle state is the predetermined voltage value during the read operation.

25. The method for controlling a storage device according to claim 17, wherein the memory cell array includes two or more internal bias lines to which different bias voltages are supplied, the method further comprising the step of transferring a remaining charge in one of the internal bias lines to another one of internal bias lines after suspending generation of the non-boosted or boosted voltage or during a bias voltage supplying operation to the one of the internal bias lines before and/or after start of the bias voltage supplying operation to the other one of internal bias lines until the other one of the internal bias lines reaches a target bias voltage.

26. A wireless communications device, said wireless communications device comprising:
a flash memory comprising:
a memory cell array;
an internal bias line which supplies a bias voltage to the memory cell array;
a DC-DC converter section having an output line coupled to the internal bias line, the DC-DC converter section boosting an external voltage to supply a boosted voltage to the output line thereof; and
a non-boosted voltage supply section having an output line coupled to the internal bias line for supplying a non-boosted voltage equal to or less than the external voltage to the output line thereof, wherein the non-boosted voltage supply section does not supply the non-boosted voltage to its output line when the internal bias line is maintained at the boosted voltage, wherein the DC-DC converter section does not supply the boosted voltage to its output line when the internal bias line is maintained at the non-boosted voltage, and wherein the non-boosted voltage supply section supplies the non-boosted voltage to the internal bias line before activation of the DC-DC converter and after activation of the DC-DC converter until the internal bias line reaches the boosted voltage;
a processor;
a communications component;
a transmitter;
a receiver; and
an antenna connected to the transmitter circuit and the receiver circuit.

27. The wireless communications device of claim 26, wherein said flash memory is NAND flash memory.

28. The wireless communications device of claim 26, wherein said flash memory is NOR flash memory.

29. The wireless communications device of claim 26, wherein said flash memory utilizes mirrorbits technology.

30. A computing device comprising:
a processor;
an input component;
an output component;
a memory comprising:
a volatile memory; and
a flash memory comprising:
a memory cell array;
an internal bias line which supplies a bias voltage to the memory cell array;
a DC-DC converter section having an output line coupled to the internal bias line, the DC-DC converter section boosting an external voltage to supply a boosted voltage to the output line thereof; and
a non-boosted voltage supply section having an output line coupled to the internal bias line for supplying a non-boosted voltage equal to or less than the external voltage to the output line thereof, wherein the non-boosted voltage supply section does not supply the non-boosted voltage to its output line when the internal bias line is maintained at the boosted voltage, wherein the DC-DC converter section does not supply the boosted voltage to its output line when the internal bias line is maintained at the non-boosted voltage, and wherein the non-boosted voltage supply section supplies the non-boosted voltage to the internal bias line before activation of the DC-DC converter and after activation of the DC-DC converter until the internal bias line reaches the boosted voltage.

31. The computing device of claim 30, wherein said computing device is a personal computer (PC).

32. The computing device of claim 30, wherein said computing device is a personal digital assistant (PDA).

33. The computing device of claim 30, wherein said computing device is a gaming system.

34. A portable media player comprising:
   a processor;
   a cache;
   a user input component;
   a coder-decoder component; and
   a memory comprising:
      a flash memory comprising:
         a memory cell array;
         an internal bias line which supplies a bias voltage to the memory cell array;
         a DC-DC converter section having an output line coupled to the internal bias line, the DC-DC converter section boosting an external voltage to supply a boosted voltage to the output line thereof; and
         a non-boosted voltage supply section having an output line coupled to the internal bias line for supplying a non-boosted voltage equal to or less than the external voltage to the output line thereof, wherein the non-boosted voltage supply section does not supply the non-boosted voltage to its output line when the internal bias line is maintained at the boosted voltage, wherein the DC-DC converter section does not supply the boosted voltage to its output line when the internal bias line is maintained at the non-boosted voltage, and wherein the non-boosted voltage supply section supplies the non-boosted voltage to the internal bias line before activation of the DC-DC converter and after activation of the DC-DC converter until the internal bias line reaches the boosted voltage.

35. The portable media player of claim 34, wherein said portable media player is a portable music player.

36. The portable media player of claim 34, wherein said portable media player is a portable video player.

37. An image capturing apparatus comprising:
   a sensor for providing image data;
   a memory capable of storing said image data, comprising:
   a memory cell array;
   an internal bias line which supplies a bias voltage to the memory cell array;
   a DC-DC converter section having an output line coupled to the internal bias line, the DC-DC converter section boosting an external voltage to supply a boosted voltage to the output line thereof;
   a non-boosted voltage supply section having an output line coupled to the internal bias line for supplying a non-boosted voltage equal to or less than the external voltage to the output line thereof, wherein the non-boosted voltage supply section does not supply the non-boosted voltage to its output line when the internal bias line is maintained at the boosted voltage, wherein the DC-DC converter section does not supply the boosted voltage to its output line when the internal bias line is maintained at the non-boosted voltage, and wherein the non-boosted voltage supply section supplies the non-boosted voltage to the internal bias line before activation of the DC-DC converter and after activation of the DC-DC converter until the internal bias line reaches the boosted voltage; and
   a display operable to display an image from said image data.

\* \* \* \* \*